(12) United States Patent
Ayres et al.

(10) Patent No.: US 8,997,502 B2
(45) Date of Patent: Apr. 7, 2015

(54) THERMOELECTRIC ASSEMBLY FOR IMPROVED AIRFLOW

(71) Applicants: Steven M. Ayres, Murphy, TX (US); Overton L. Parish, IV, Frisco, TX (US)

(72) Inventors: Steven M. Ayres, Murphy, TX (US); Overton L. Parish, IV, Frisco, TX (US)

(73) Assignee: Marlow Industries, Inc., Dallas, TX (US)

(*) Notice: Subject to any disclaimer, the term of this patent is extended or adjusted under 35 U.S.C. 154(b) by 197 days.

(21) Appl. No.: 13/780,481

(22) Filed: Feb. 28, 2013

(65) Prior Publication Data

US 2013/0227966 A1  Sep. 5, 2013

Related U.S. Application Data

(60) Provisional application No. 61/605,258, filed on Mar. 1, 2012.

(51) Int. Cl.
| | |
|---|---|
| *F25B 21/02* | (2006.01) |
| *H05K 13/00* | (2006.01) |
| *H01L 35/32* | (2006.01) |

(52) U.S. Cl.
CPC ............ *F25B 21/02* (2013.01); *H05K 13/0023* (2013.01); *H01L 35/32* (2013.01)

(58) Field of Classification Search
CPC ..... F25B 21/02; H01L 35/32; H01L 13/0023; H01L 13/00

USPC ......... 62/3.2, 3.3, 3.7; 29/529.1, 592.1, 896.3
See application file for complete search history.

(56) References Cited

U.S. PATENT DOCUMENTS

| | | | |
|---|---|---|---|
| 4,833,888 A * | 5/1989 | Kerner et al. ..................... 62/3.3 |
| 8,705,236 B2 * | 4/2014 | Uchida et al. ................. 361/700 |
| 8,707,715 B2 * | 4/2014 | Okuda et al. ..................... 62/3.2 |
| 8,728,846 B2 * | 5/2014 | Male et al. ...................... 438/54 |
| 2001/0013224 A1 * | 8/2001 | Ohkubo et al. .................. 62/3.7 |
| 2003/0126865 A1 * | 7/2003 | Venkatasubramanian ....... 62/3.2 |
| 2003/0172657 A1 * | 9/2003 | Ohkubo et al. .................. 62/3.3 |
| 2008/0163916 A1 * | 7/2008 | Tsuneoka et al. ............. 136/203 |
| 2008/0229758 A1 * | 9/2008 | Lin et al. .......................... 62/3.2 |
| 2010/0081191 A1 * | 4/2010 | Woods ........................ 435/303.1 |
| 2011/0239635 A1 * | 10/2011 | Prior et al. ...................... 60/320 |
| 2012/0023970 A1 * | 2/2012 | Lee et al. .......................... 62/3.2 |
| 2012/0192574 A1 * | 8/2012 | Ghoshal et al. .................. 62/3.2 |

* cited by examiner

*Primary Examiner* — Mohammad M Ali
(74) *Attorney, Agent, or Firm* — Baker Botts L.L.P.

(57) ABSTRACT

In one embodiment, a system includes a first thermoelectric assembly that includes a first set of thermoelectric elements and a first plate and a second plate are coupled to the first set of thermoelectric elements. A second thermoelectric assembly is spaced apart from the first thermoelectric assembly. It includes a second set of thermoelectric elements and a third plate and a fourth plate are coupled to the second set of thermoelectric elements. A first set of fins is coupled to the first plate and a second set of fins is coupled to the third plate. A third set of fins is coupled to the second plate and a fourth set of fins is coupled to the fourth plate. A fan is coupled to the first and second sets of fins and is substantially centered with respect to a gap between the first and second sets of fins.

20 Claims, 4 Drawing Sheets

US 8,997,502 B2

THERMOELECTRIC ASSEMBLY FOR IMPROVED AIRFLOW

RELATED APPLICATION

This application claims benefit under 35 U.S.C. § 119(e) of U.S. Provisional Application Ser. No. 61/605,258, titled "Thermoelectric Assembly For Improved Airflow," Attorney's Docket 017083.0338, filed Mar. 1, 2012, by Steven M. Ayres, et al.

TECHNICAL FIELD

This disclosure relates generally to thermoelectric devices and more particularly to a thermoelectric assembly for improved airflow.

BACKGROUND

The basic theory and operation of thermoelectric devices has been developed for many years. Presently available thermoelectric devices used for cooling typically include an array of thermocouples that operate in accordance with the Peltier effect. Thermoelectric devices may also be used for heating, power generation and temperature sensing.

Thermoelectric devices may be described as essentially small heat pumps that follow the laws of thermodynamics in the same manner as mechanical heat pumps, refrigerators, or any other apparatus that is used to transfer heat energy. A principal difference is that thermoelectric devices function with solid state electrical components (thermoelectric elements or thermocouples) as compared to more traditional mechanical/fluid heating and cooling components.

Air to air thermoelectric cooling assemblies typically have a fan mounted over the tips of the fins of a heat sink, blowing into the sink in an impinging orientation. This mounting configuration leaves a dead line of airflow at the middle of the sink where the airflow is stagnant. This makes the sink inefficient, as well as adding pressure drop to the system reducing the total flow rate.

SUMMARY

In one embodiment, a system includes a first thermoelectric assembly. The first thermoelectric assembly includes a first set of thermoelectric elements and a first plate (e.g., element 370a of FIG. 3) coupled to the first set of thermoelectric elements. The first thermoelectric assembly also includes a second plate (e.g., element 370b of FIG. 3) coupled to first set of thermoelectric elements. The system further includes a second thermoelectric assembly. The second thermoelectric assembly is spaced apart from the first thermoelectric assembly. The second thermoelectric assembly includes a second set of thermoelectric elements and a third plate coupled (e.g., element 370c of FIG. 3) to the second set of thermoelectric elements. A fourth plate (e.g., element 370d of FIG. 3) is coupled to the second set of thermoelectric elements. The system includes a first set of fins coupled to the first plate and a second set of fins coupled to the third plate. The second set of fins is spaced apart from the first set of fins by a first gap. The system includes a third set of fins coupled to the second plate and a fourth set of fins coupled to the fourth plate. The third set of fins is spaced apart from the fourth set of fins by a second gap. The system includes a first fan coupled to the first set of fins and the second set of fins. The first fan is substantially centered with respect to the first gap.

In some embodiments, the system can include a first divider situated in the first gap and a second divider situated in the second gap. The first divider and the second divider may be angled and/or radiused.

In one embodiment, a method includes coupling a first set of fins to a first plate of a first thermoelectric assembly. The first thermoelectric assembly includes a first set of thermoelectric elements. The first plate is coupled to the first set of thermoelectric elements. The first thermoelectric assembly includes a second plate coupled to first set of thermoelectric elements. The method includes coupling a second set of fins to a third plate of a second thermoelectric assembly. The second set of fins is spaced apart from the first set of fins by a first gap. The second thermoelectric assembly is spaced apart from the first thermoelectric assembly. The second thermoelectric assembly includes a second set of thermoelectric elements. The third plate is coupled to the second set of thermoelectric elements. The second thermoelectric assembly includes a fourth plate coupled to the second set of thermoelectric elements. The method includes coupling a third set of fins the second plate and coupling a fourth set of fins to the fourth plate. The third set of fins is spaced apart from the fourth set of fins by a second gap. The method includes coupling a first fan to the first set of fins and the second set of fins. The first fan is substantially centered with respect to the first gap.

Depending on the specific features implemented, particular embodiments may exhibit some, none, or all of the following technical advantages. Pressure drops present in thermoelectric systems may be reduced. Airflow in thermoelectric systems may be facilitated. Other technical advantages will be readily apparent to one skilled in the art from the following figures, description and claims.

BRIEF DESCRIPTION OF THE DRAWINGS

Reference is now made to the following description taken in conjunction with the accompanying drawings, wherein like reference numbers represent like parts and which.

DETAILED DESCRIPTION

Figure 1:
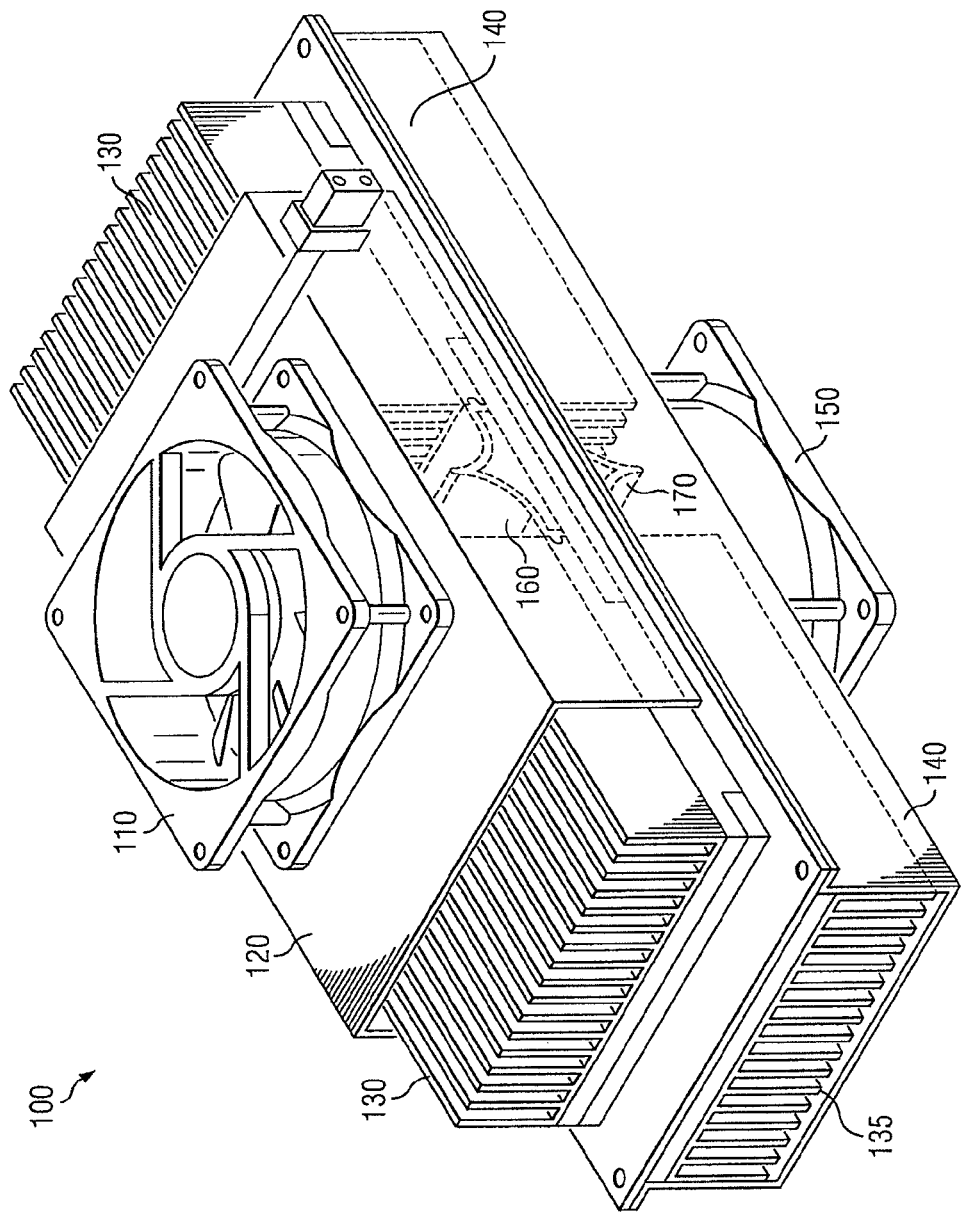
FIG. 1 illustrates one embodiment of a system that provides improved airflow in a thermoelectric assembly.

FIG. 1 illustrates one embodiment of system 100 that provides for improved airflow in a thermoelectric assembly. System 100 includes fan 110 coupled to housing 120 that includes fins 130. Housing 120 is coupled to housing 140 which includes fins 135. Fan 150 is coupled to housing 140. Fins 130 are coupled to a thermoelectric assembly not depicted in FIG. 1. One or more embodiments of such an assembly are described below with respect to FIG. 2. In operation, system 100 may be configured to draw heat from components that may be coupled to or near fan 110 and cause the heat to be transferred through housing 120 and fins 130. Thermoelectric elements may be situated at the junction of housing 120 and 130 which may allow the heat to be transferred within housing 140. This may be facilitated by fins 135. Fan 150 may remove heat from housing 140. Dividers 160 and 170 may divide fins 130 and 135; in some embodiments, dividers 160 and 170 may not be used. As discussed further below with respect to FIGS. 3 and 4, dividers 160 and 170 may improve airflow within system 100.

In some embodiments, when system 100 is attached to an appropriate source of power (e.g., a DC battery), one side of system 100 will generate heat and the other side will absorb heat. The polarity of the current from the power source determines which side of system 100 absorbs heat and which side generates heat. Fans 110 and 150 may circulate a flowable medium across system 100. Fins 130 and 135 may aid in transferring thermal energy into or out of system 100 by increasing the amount of surface area over which system 100 may dissipate thermal energy into the flowable medium or absorb thermal energy from the flowable medium.

In some embodiments, fins 130 and 135 may be any fixture (e.g., a cold sink or a hot sink) capable of increasing the surface area over which system 100 may exchange thermal energy with a flowable medium (e.g., air). For example, fins 130 and 135 may be a zipped or stacked fin heat exchanger comprising a plurality of closely-spaced fins separated from one another by a series of spaces. Each fin may include one or more flanges or other features operable to interlock the plurality of fins together into a single, unitary array. For example, flanges may be a series of frusto-conically-shaped perforations in fins 130 and 135 that are nested inside one another to link each of the individual fins together. Fins 130 and 135 may include a plurality of zipped fin structures, with each having a flat bottom coupled to a plurality of parallel fins. Fins 130 and/or 135 may be implemented using extrusion or skiving processes.

In other embodiments, fins 130 and/or 135 may be a folded fin structure comprising a single sheet of material (e.g., copper) that has been consecutively folded over onto itself to create a single array of closely spaced fins. Each fin may include a lateral (e.g., generally L-shaped) fold at one end that, when aggregated together, form a flat. Fins 130 and 135 may be constructed out of a thermally conductive material such as copper, aluminum or other metal. However, any suitable thermally conductive material may be used. Stamped or rolled fins may be used.

The following table provides example parameters that may be used when implementing fins 130 and/or 135 in some embodiments. Other suitable values and limits (e.g., minimum or maximum values) may be used other than the following examples:

| Parameter | Extruded | Skived |
|---|---|---|
| Thickness (mm) | Minimum: 0.8 | Minimum: 0.2 |
| | Example: 1 | Example: 0.5 |
| Pitch (mm) | Minimum: 2.78 | Minimum: 0.6 |
| | Example: 3.13 | Example: 2.42 |
| Height (mm) | Maximum: 26 | Maximum: 50 |
| | Example: 20 | Example: 30 |
| No. of Fins (150 mm wide) | Maximum: 54 | Maximum: 250 |
| | Example: 48 | Example: 62 |
| Fin Assembly Length | Example: 400 | Example: 400 |
| Surface Area ($cm^2$) | Maximum: 11232 | Minimum: 85000 |
| | Example: 9984 | Example: 12648 |
| Weight/Length (g/mm) | Example: 3.37 | Example: 2.51 |

In cases where flowable medium is a gas such as air, due to the tight fin pitch (e.g., close fin spacing) associated with zipped or folded fin structures, strong capillary forces may fill spaces in fins 130 and/or 135 with moisture at sub-ambient temperatures. The accumulation of moisture may impede the flow of flowable medium through system 100, thereby reducing its efficiency. In order to counteract the tendency of spaces in fins 130 and/or 135 to fill with moisture, a hydrophobic coating may be applied to or incorporated into fins 130 and/or 135. The hydrophobic coating may be any compound or formula capable of preventing or retarding the accumulation of moisture on fins 130 and/or 135 during operation of temperature system 100. As an example and not by way of limitation, the hydrophobic coating may be SILANE manufactured by Dow Corning, Inc.

Figure 2:
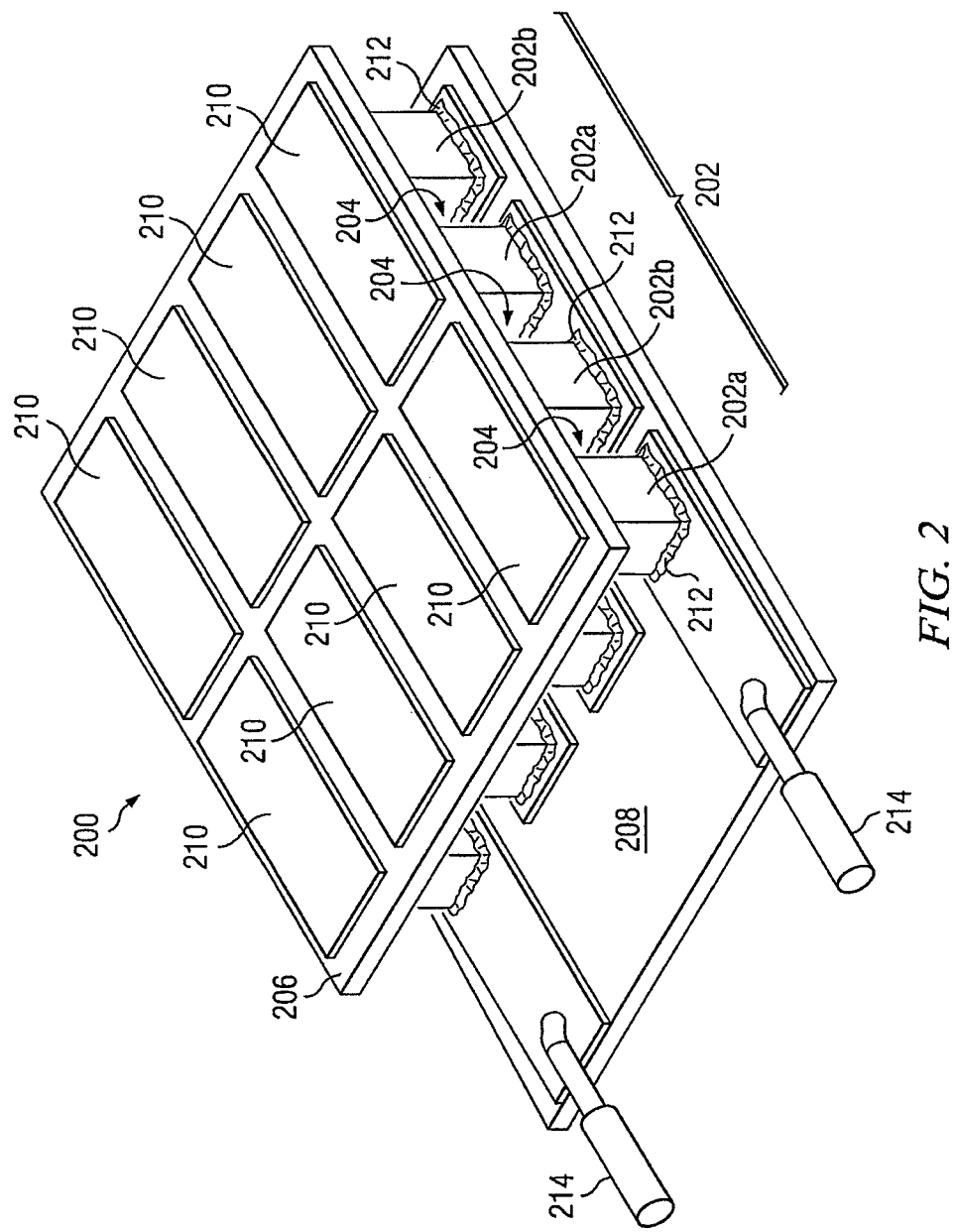
FIG. 2 illustrates one embodiment of a thermoelectric assembly that may be situated between fins of FIG. 1.

FIG. 2 illustrates one embodiment of thermoelectric assembly 200 that may be situated between fins 130 and 135 of FIG. 1. Thermoelectric assembly 200 may include thermoelectric elements 202 fabricated from dissimilar semiconductor materials such as N-type thermoelectric elements 202a and P-type thermoelectric elements 202b. Thermoelectric elements 202 are typically configured in a generally alternating N-type element to P-type element arrangement and typically include an air gap 204 disposed between adjacent N-type and P-type elements. In many thermoelectric devices, thermoelectric materials with dissimilar characteristics are connected electrically in series and thermally in parallel.

Thermoelectric assembly 200 may be used as a heater, cooler, electrical power generator, and/or temperature sensor. If thermoelectric assembly 200 were designed to function as an electrical power generator, leads 214 would represent the output terminals from such a power generator operating between hot and cold temperature sources.

Examples of thermoelectric devices and methods of fabrication are shown in U.S. Pat. No. 5,064,476 titled Thermoelectric Cooler and Fabrication Method; U.S. Pat. No. 5,171,372 titled Thermoelectric Cooler and Fabrication Method; and U.S. Pat. No. 5,576,512 titled Thermoelectric Apparatus for Use With Multiple Power Sources and Method of Operation.

N-type semiconductor materials generally have more electrons than necessary to complete the associated crystal lattice structure. P-type semiconductor materials generally have fewer electrons than necessary to complete the associated crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers which transport or move heat energy between cold side or cold plate 206 and hot side or hot plate 208 through thermoelectric elements 200 when subject to a DC voltage potential. These same agents or carriers may generate electrical power when an appropriate temperature difference is present between cold side 206 and hot side 208. Leads 214 may be coupled to plate 208 in a manner that withstands high temperature environments, such as resistance welding, tungsten inert gas (TIG) welding, and laser welding.

In some embodiments, thermoelectric elements 202 may include high temperature thermoelectric material. Examples of high temperature thermoelectric materials include lead telluride (PbTe), lead germanium telluride (PbGeTe), TAGS alloys (such as $(GeTe)_{0.85}(AgSbTe_2)_{0.15}$), bismuth telluride ($Bi_2Te_3$), and skutterudites.

In some embodiments, thermoelectric elements 202 may include a diffusion barrier that includes refractory metals (e.g., a metal with a melting point above 1,850° C.). Suitable refractory metals may include those that are metallurgically compatible with high temperature thermoelectric materials and metallurgically compatible with other components of thermoelectric assembly 200. For example, a molybdenum diffusion barrier may be used. This may be advantageous in that molybdenum may be metallurgically compatible with various aspects of thermoelectric assembly 200. For example, as further discussed below, thermoelectric assembly 200 may include an aluminum braze that is metallurgically compatible with a molybdenum diffusion barrier. Such a diffusion barrier may prevent or reduce the chance or occurrence of Kirkendall voiding in thermoelectric assembly 200. Other suitable examples of a diffusion barrier that has similar properties to molybdenum include tungsten, nickel, and titanium.

In some embodiments, alternating thermoelectric elements 202 of N-type and P-type semiconductor materials may have their ends connected by electrical conductors 210. Conductors 210 may be metallizations formed on thermoelectric elements 202 and/or on the interior surfaces of plates 206 and 208. Conductors 210 may include aluminum. Ceramic materials may be included in plates 206 and 208 which define in part the cold side and hot side, respectively, of thermoelectric assembly 200. In some embodiments, the ceramic materials may provide electrical isolation from hot and cold side sources. Aluminum metallized ceramics may accommodate thermal stresses (e.g., due to high temperature exposure) of the ceramic/aluminum bond. Examples of suitable ceramic materials include aluminum oxide, aluminum nitride, and beryllium oxide.

In some embodiments, thermoelectric elements 202 may be coupled to plates 206 and 208 using medium 212. Medium 212 may include brazes and/or solders. For example, aluminum-based brazes and/or solders may be used, such as aluminum silicon (AlSi) braze family and/or zinc-aluminum (ZnAl) solder. In some embodiments, using such brazes and/or solders may provide for operation in a high temperature (e.g., greater than 200 degrees Celsius) environment and allow for flexible joints. Kirkendall voiding may be prevented or reduced.

In some embodiments, using one or more of the configurations discussed above, thermoelectric device 200 may be suitable as a fixed-joint, high temperature thermoelectric generator that is capable of being used in high temperature applications. For example, a thermoelectric generator built using skutterudite thermoelectric elements that include a molybdenum diffusion barrier, conductors formed by aluminum metallizations, and aluminum based brazes may result in a device that can operate with at least one of its plates (such as plates 206 or 208) in an environment with a temperature at or greater than 500 degrees Celsius. As another example, a thermoelectric generator built using bismuth telluride thermoelectric elements that include a molybdenum diffusion barrier, conductors formed by aluminum metallization, and zinc-aluminum (ZnAl) solder may result in a device that can operate with at least one of its plates (such as plates 206 or 208) at a temperature greater than 300 degrees Celsius. As another example, thermoelectric device 200 may be used in automotive waste heat recovery applications. One advantage present in certain embodiments may be that the use of aluminum metallization on plates 206 and 208 and the manner in which the metallization is formed (e.g., as described below with respect to FIGS. 4 and 5) may provide thermoelectric device 200 with resilience to thermal cycling which can be useful in high temperature (e.g., greater than 200 degrees Celsius) power generation applications.

Figure 3:
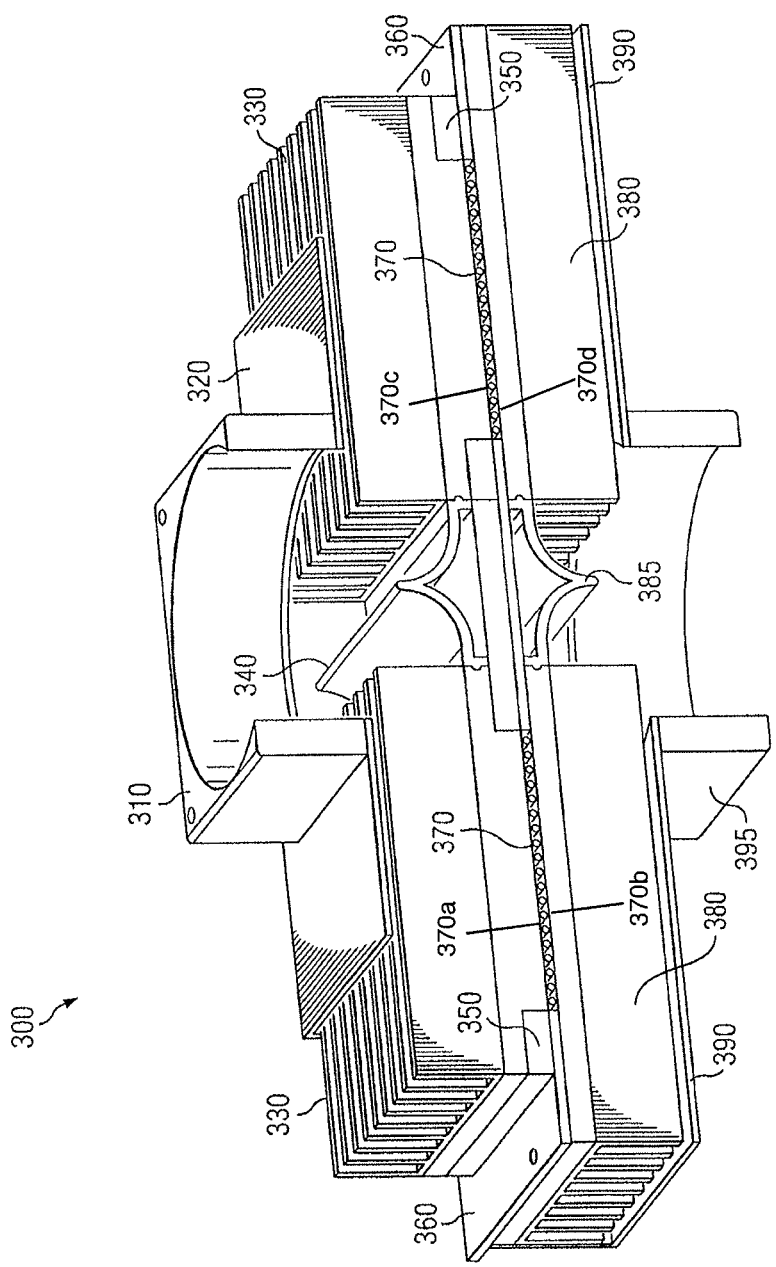
FIG. 3 is a cutaway diagram of one embodiment of a system that provides for improved airflow in a thermoelectric assembly.

FIG. 3 is a cutaway diagram of one embodiment of system 300 that provides for improved airflow in a thermoelectric assembly. System 300 may be used to implement one or more aspects of system 100 of FIG. 1. System 300 includes thermoelectric assemblies 370 that have hot sides 370b and 370d and cold sides 370a and 370c. Cold sides 370a and 370c of thermoelectric assemblies 370 is coupled to fins 330 and hot sides 370b and 370d of thermoelectric assemblies 370 is coupled to fins 380. Divider 340 separates one set of fins 330 from another set of fins 330. Divider 385 separates one set of fins 380 from another set of fins 380. Gasket 360 is attached to fins 380 and may be used to facilitate airflow through fins 330. Insulator 350 (e.g., foam insulation sheet(s)) serves as an interface between gasket 360 and fins 330. Shroud 320 interfaces with fins 330 and surrounds fan 310. Shroud 390 interfaces with fins 380 and surrounds fan 395. Fans 310 and 395 may be configured to facilitate airflow through system 300.

In some embodiments, the gap between the sets of fins 330 in which divider 340 resides is centered under fan 310. This may be advantageous because pressure drop in system 300 may be reduced and airflow may be facilitated. A benefit of the reduced pressure drop is that it can allow for fan 310 to be implemented with a lower powered fan than would have otherwise been possible. Using a lower powered fan in system 300 may increase efficiency of system 300 and reducing noise levels generated by system 300. The description of fins 330 and divider 340 discussed above may also apply to fins 380 and divider 385.

In some embodiments, a circuit board may be used to configure thermoelectric assemblies 370. The circuit board may be in or across the gap between the sets of fins 330 and be electrically coupled to thermoelectric assemblies 370 using leads or other suitable techniques. The circuit board may be used to provide one or more aspects of control to thermoelectric assemblies 370. The circuit board may include integrated components such as controllers to provide functionality such as temperature control. For example, the circuit board may be used as a temperature controller that turns thermoelectric assemblies 370 on and off based on one or more temperature thresholds (e.g., using thermal switches). One or more advantages may be present in some embodiments when the circuit board is used. One such advantage is that a temperature controller can be embedded within system 300. Another such advantage is that fabrication of system 300 may be facilitated by having thermoelectric assemblies 370 be maintained in a substantially fixed position by being coupled to the circuit board.

In some embodiments, the split configuration of fins 330 and of fins 385 may provide for more effective use of high density fins and there by improving performance of system 300. Problems with the use of high density fins due to inefficient performance in a standard flow impingement configuration may be overcome using the split configuration of fins 330 and fins 385 because there is a reduced flow length. This may ameliorate the negative impact of pressure drop in system 300. Each of fins 330 and 385, in some embodiments, may be integrated into a single structure. For example, fins 330 may be integrated into a single structure by connecting the two sets of fins included in fins 330 to a single sheet, slab or bar.

In some embodiments, implementing fins 330 and 380 as a combination of sets of fins separated by a gap may reduce inefficiencies due to heat spreading in the base of fins 330 and 380 (e.g., where fins 330 and 380 contact thermoelectric assemblies 370. Parasitic heat transfer may be reduced from fins 380 to fins 330. These example advantages may indicate how system 300 may have improved performance and efficiency as a thermoelectric cooling system. The distance between fins 330 and fan 310 as well as the distance between fins 380 and fan 395 may be reduced from conventional designs thereby increasing efficiency in system 300.

In some embodiments, dividers 340 and 385 may be radiused or angled. By including dividers 340 and 385 in the gaps between sets of fins of fins 330 and 380, airflow may be facilitated by changing the direction of airflow from perpendicular to the interfaces of fins 330 and 380 to parallel to the interfaces of fins 330 and 380. This may reduce air pressure drop in system 300. The change in airflow direction may transfer more air to the base of fins 330 and 380 thereby improving convection coefficients of fins 330 and 380. In some embodiments, dividers 340 and/or 385 may be configured to facilitate an even distribution of airflow across the width of fins 330 and/or 385 counteracting fan swirl from fans 310 and/or 395 that may cause uneven airflow. Performance of system 300 may be improved. While the depicted embodiment discloses the use of two dividers 340 and 385, other embodiments may use more or fewer dividers. For example, dividers 340 and 385 may be configured as a single unit.

Figure 4:
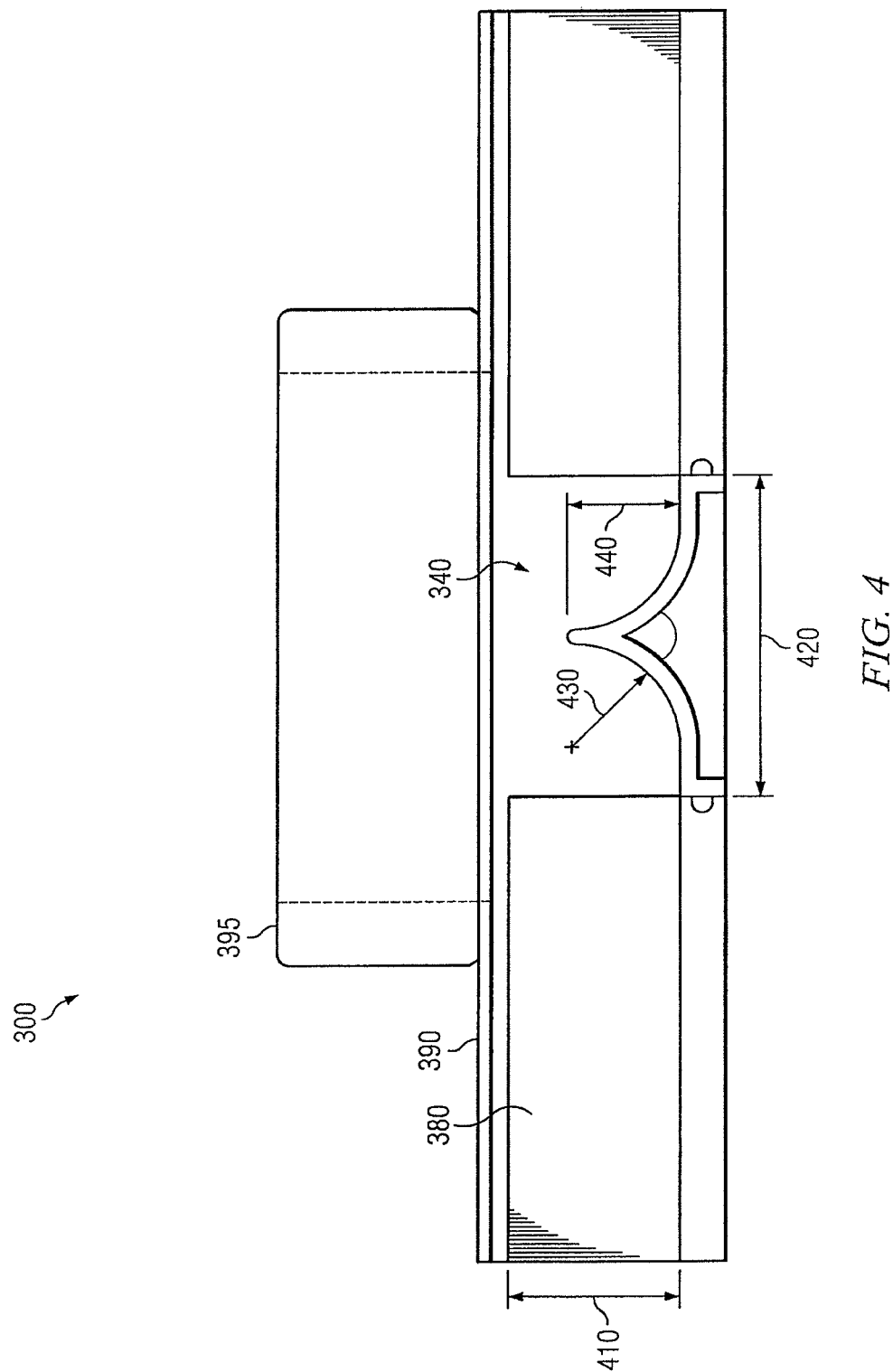
FIG. 4 illustrates example parameters of the system illustrated in FIG. 3.

FIG. 4 illustrates example parameters of system 300 that may be modified to increase the efficiency of system 300. While FIG. 4 illustrates parameters related to divider 385 and fins 380, similar parameters may be present in other aspects of system 300 (e.g., fins 330 and divider 340). Height 410 pertains to the height of fins 380. Length 420 (e.g., 60 mm in value) pertains to the gap between the sets of fins 380. Radius 430 and height 440 defines the shape of divider 385. Other suitable parameters may be modified to facilitate the operation of system 300.

Depending on the specific features implemented, particular embodiments may exhibit some, none, or all of the following technical advantages. Systems 100 and 300 may allow for efficient use of high density fins in a flow impingement configuration. Air pressure drops may be reduced. Reduced weight and cost may also be achieved using the split fin configuration (e.g., as depicted in FIG. 3). Higher performing cooling systems may be packaged into a smaller footprint than with traditional designs. For example, a 12-45% increase in cooling efficiency may be achieved in a configuration 75% of the size of conventional designs. The use of a radiused divider (e.g., divider 340) may increase cooling efficiency by 5-15% compared to a flat plate. Other technical advantages will be readily apparent to one skilled in the art from the preceding figures and description as well as the proceeding claims. Particular embodiments may provide or include all the advantages disclosed, particular embodiments may provide or include only some of the advantages disclosed, and particular embodiments may provide none of the advantages disclosed.

Although several embodiments have been illustrated and described in detail, it will be recognized that modifications and substitutions are possible without departing from the spirit and scope of the appended claims.

What is claimed is:

1. A system comprising:
a first thermoelectric assembly comprising:
    a first set of thermoelectric elements;
    a first plate coupled to the first set of thermoelectric elements; and
    a second plate coupled to first set of thermoelectric elements;
a second thermoelectric assembly, the second thermoelectric assembly spaced apart from the first thermoelectric assembly, the second thermoelectric assembly comprising:
    a second set of thermoelectric elements;
    a third plate coupled to the second set of thermoelectric elements; and
    a fourth plate coupled to the second set of thermoelectric elements;
a first set of fins coupled to the first plate;
a second set of fins coupled to the third plate, the second set of fins spaced apart from the first set of fins by a first gap;
a third set of fins coupled to the second plate;
a fourth set of fins coupled to the fourth plate, the third set of fins spaced apart from the fourth set of fins by a second gap; and
a first fan coupled to the first set of fins and the second set of fins, the first fan substantially centered with respect to the first gap.

2. The system of claim 1, further comprising:
a first divider situated in the first gap; and
a second divider situated in the second gap.

3. The system of claim 2, wherein the first divider and the second divider are angled.

4. The system of claim 2, wherein the first divider and the second divider are radiused.

5. The system of claim 1, further comprising a second fan coupled to the third set of fins and the fourth set of fins, the second fan substantially centered with respect to the second gap.

6. The system of claim 1, wherein the first set of fins and the second set of fins comprise a hydrophobic coating.

7. The system of claim 1, wherein the first set of fins and the second set of fins comprise skived fins.

8. The system of claim 1, wherein:
the first set of fins and the second set of fins are integrated into a first structure; and
the third set of fins and the fourth set of fins are integrated into a second structure.

9. The system of claim 1, further comprising a divider situated in both the first gap and the second gap.

10. The system of claim 1, further comprising a circuit board, the circuit board coupled to the first set of thermoelectric elements and the second set of thermoelectric elements.

11. A method comprising:
coupling a first set of fins to a first plate of a first thermoelectric assembly, the first thermoelectric assembly comprising:
    a first set of thermoelectric elements;
    the first plate coupled to the first set of thermoelectric elements; and
    a second plate coupled to first set of thermoelectric elements;
coupling a second set of fins to a third plate of a second thermoelectric assembly, the second set of fins spaced apart from the first set of fins by a first gap, the second thermoelectric assembly spaced apart from the first thermoelectric assembly, the second thermoelectric assembly comprising:
    a second set of thermoelectric elements;
    the third plate coupled to the second set of thermoelectric elements; and
    a fourth plate coupled to the second set of thermoelectric elements;
coupling a third set of fins the second plate;
coupling a fourth set of fins to the fourth plate, the third set of fins spaced apart from the fourth set of fins by a second gap; and
coupling a first fan to the first set of fins and the second set of fins, the first fan substantially centered with respect to the first gap.

12. The method of claim 11, further comprising:
situating a first divider in the first gap; and
situation a second divider in the second gap.

13. The method of claim 12, wherein the first divider and the second divider are angled.

14. The method of claim 12, wherein the first divider and the second divider are radiused.

15. The method of claim 11, further comprising coupling a second fan to the third set of fins and the fourth set of fins, the second fan substantially centered with respect to the second gap.

16. The method of claim 11, wherein the first set of fins and the second set of fins comprise a hydrophobic coating.

17. The method of claim 11, wherein the first set of fins and the second set of fins comprise skived fins.

18. The method of claim 11, wherein:
   the first set of fins and the second set of fins are integrated into a first structure; and
   the third set of fins and the fourth set of fins are integrated into a second structure.

19. The method of claim 11, further comprising situating a divider in both the first gap and the second gap.

20. The method of claim 11, coupling a circuit board to the first set of thermoelectric elements and the second set of thermoelectric elements.

* * * * *